(12) United States Patent
Rich et al.

(10) Patent No.: US 7,409,613 B2
(45) Date of Patent: Aug. 5, 2008

(54) SIMULTANEOUS AC LOGIC SELF-TEST OF MULTIPLE CLOCK DOMAINS

(75) Inventors: Marvin J. Rich, Poughkeepsie, NY (US); Jay R. Herring, Poughkeepsie, NY (US); Ronald A. Linton, Rhinebeck, NY (US)

(73) Assignee: International Business Machines Corporation, Armonk, NY (US)

( * ) Notice: Subject to any disclaimer, the term of this patent is extended or adjusted under 35 U.S.C. 154(b) by 583 days.

(21) Appl. No.: 10/753,801

(22) Filed: Jan. 8, 2004

(65) Prior Publication Data

US 2005/0166104 A1 Jul. 28, 2005

(51) Int. Cl.
G01R 31/28 (2006.01)
G11B 20/20 (2006.01)

(52) U.S. Cl. ...................... 714/731; 714/700
(58) Field of Classification Search .......... 714/726–731
See application file for complete search history.

(56) References Cited

U.S. PATENT DOCUMENTS

| 5,222,237 | A | * | 6/1993 | Hillis ......................... 712/204 |
| 5,349,587 | A | | 9/1994 | Nadeau-Dostie et al. ... 371/22.3 |
| 5,680,543 | A | | 10/1997 | Bhawmik .............. 395/183.06 |
| 5,900,753 | A | | 5/1999 | Cote et al. .................. 327/145 |
| 5,909,451 | A | | 6/1999 | Lach et al. ............... 371/22.31 |
| 6,115,827 | A | | 9/2000 | Nadeau-Dostie et al. .... 713/503 |
| 6,163,545 | A | | 12/2000 | Flood et al. ................ 370/465 |
| 6,247,082 | B1 | | 6/2001 | Lo et al. ..................... 710/105 |
| 6,327,684 | B1 | * | 12/2001 | Nadeau-Dostie et al. .... 714/731 |
| 6,327,685 | B1 | | 12/2001 | Koprowski et al. .......... 714/733 |
| 6,434,733 | B1 | | 8/2002 | Duggirala et al. ............. 716/11 |
| 6,442,722 | B1 | * | 8/2002 | Nadeau-Dostie et al. .... 714/731 |
| 6,467,044 | B1 | | 10/2002 | Lackey ...................... 713/501 |
| 2004/0163021 | A1 | * | 8/2004 | Nadeau-Dostie ............ 714/726 |
| 2005/0055615 | A1 | * | 3/2005 | Agashe et al. .............. 714/727 |

FOREIGN PATENT DOCUMENTS

EP WO 02/077656 A1 3/2002

OTHER PUBLICATIONS

Schmid, et al., "Advanced Synchronous Scan Test Methodology for Multi Clock Domain ASICs", Proceedings 17th, IEEE VLSI Test Symposium, pp. 106-113, 1999.

(Continued)

*Primary Examiner*—Cynthia Britt
(74) *Attorney, Agent, or Firm*—Joseph Biela, Esq.; Jill M. Breedlove, Esq.; Heslin Rothenberg Farley & Mesiti P.C.

(57) ABSTRACT

A technique is provided for simultaneous and/or selective self-testing of internal logic and asynchronous boundaries of an IC having a plurality of clock domains. A clock command is generated by an on product clock generator for each clock domain simultaneously; and an asynchronous receive clock driver provides a programmable delay to a capture clock based on predetermined cycle requirements of the asynchronous boundaries. Asynchronous boundary test requirements are defined exclusively from the perspective of the asynchronous boundary receiver latches, thereby reducing dependencies among clock domains. Advantageously, the design of internal logic and asynchronous boundaries of each clock domain, ultimately residing within an IC, can proceed without a priori knowledge of how the clock domain will eventually be used in aggregation with other clock domains.

6 Claims, 5 Drawing Sheets

OTHER PUBLICATIONS

IBM Technical Disclosure Bulletin, "Method and Apparatus for Handling Multiple Clock Domain at Speed Logic Built-in Self-Test within a Single Logic Built-in Self-Test Structure", vol. 38, No. 11, Nov. 1995, p. 499.

* cited by examiner

SIMULTANEOUS AC LOGIC SELF-TEST OF MULTIPLE CLOCK DOMAINS

CROSS-REFERENCE TO RELATED APPLICATION

This application contains subject matter which is related to the subject matter of the following application, which is assigned to the same assignee as this application and which is hereby incorporated herein by reference in its entirety:

"Scalable Logic Self-Test Configuration For Multiple Chips," Rich et al., Ser. No. 10/753,852, co-filed herewith.

TECHNICAL FIELD

This invention relates generally to testing integrated circuit chips, and, more particularly, to self-testing logic and asynchronous boundaries of chips having multiple clock domains, simultaneously and/or selectively.

BACKGROUND OF THE INVENTION

Density and complexity of today's high-end application-specific integrated circuit (ASIC) chips continue to increase. As a result, multiple clock domains, i.e., logic circuits operating at different clock frequencies, often exist within a single chip. The asynchronous boundaries between clock domains are typically not timed interfaces, such that the values at the asynchronous boundaries arrive unpredictably. This creates a challenge when performing simultaneous logic built-in self-testing (LBIST) of all clock domains in a chip, such that there is a relatively high probability of not matching a good chip signature, due to multi-cycle characteristics of asynchronous boundaries. One solution has been to perform a separate LBIST sequence on each separate clock domain. Unfortunately, this is inefficient since it requires multiple LBIST iterations for each clock domain, and, moreover, does not address asynchronous boundary testing. Another solution has been to utilize an optimized clock design with special tuned circuitry to delay capture clocks in order to exclusively test AC or DC characteristics at specific asynchronous boundaries, without taking into account conflicting effects due to internal logic or other asynchronous boundaries. In either case, there is a requirement of detailed, a priori knowledge of the clock domain frequency requirements of each component as well as additional test design overhead to achieve desired test results.

Accordingly, it is desirable to provide an improved technique for self-testing IC's having multiple clock domains. It is further desirable that such technique provides for testing internal chip logic, while simultaneously providing for testing asynchronous clock boundaries. Such a technique would advantageously facilitate aggregation of independently designed logic circuits employed in Systems on a Chip (SoC's), for example, each having its own independently designed clock domain.

SUMMARY OF THE INVENTION

The shortcomings of the prior art are overcome and additional advantages are provided through a technique for simultaneous and/or selective self-testing of internal logic and asynchronous boundary requirements of an IC having a plurality of clock domains.

In one aspect of the invention, an on product clock generation (OPCG) logic core is provided for receiving commands from a self-test state machine (STSM), or another OPCG; and for simultaneously providing a clock command to each clock domain. The OPCG provides functional clock sequences during normal operation, and test clock sequences during testing operation. In one embodiment, the OPCG core comprises functions for self-testing internal logic for each clock domain, and for simultaneously issuing launch clocks to the driving latches of the asynchronous boundaries on the IC. An asynchronous boundary receive clock driver is associated with each asynchronous boundary for providing capture clocks for the receiving latches at each asynchronous clock boundary interface.

For each asynchronous boundary, the asynchronous boundary receive clock driver comprises logic for selecting the normal mode or test mode of operation. During normal mode, the driver generates a normal operational clock sequence. In LBIST test mode, separate programmable clock delays are associated with each respective asynchronous boundary receive clock driver in order to simultaneously test the multi-cycle requirements of each asynchronous boundary of a clock domain.

In another aspect of the invention, selective testing may be performed on the internal logic or on the asynchronous boundaries of an IC, or any combination thereof, and for any of the clock domains on the chip, or any combination thereof.

Systems and computer program products corresponding to the above-summarized methods are also described and claimed herein.

Further, additional features and advantages are realized through the techniques of the present invention. Other embodiments and aspects of the invention are described in detail herein and are considered a part of the claimed invention.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

BEST MODE FOR CARRYING OUT THE INVENTION

Presented herein is a technique for simultaneous and selective logic built-in self-testing of both internal logic and asynchronous boundaries in an IC having a plurality of clock domains.

Figure 1:
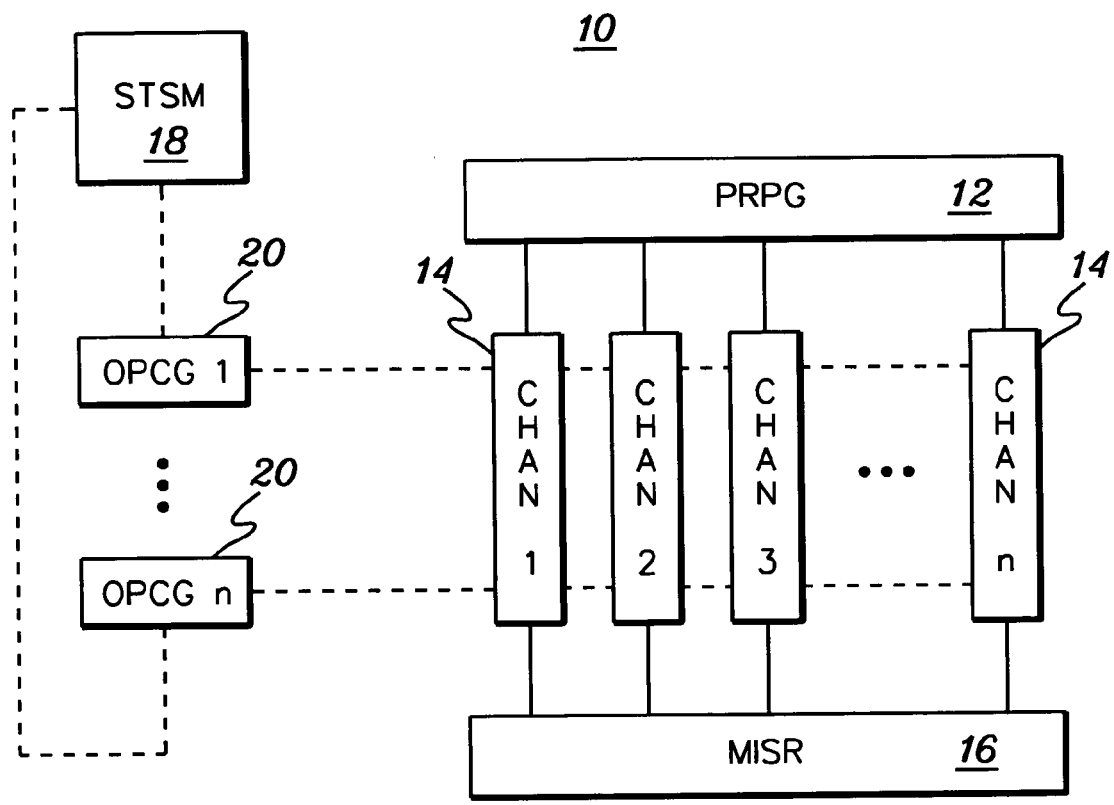
FIG. 1 depicts a block diagram of a typical LBIST configuration.

FIG. 1 is a block diagram of a typical LBIST system 10. A pseudo random pattern generator (PRPG) 12 comprises linear feedback shift registers for generating random patterns to feed latches configured as multiple scan channels 14. The output from each scan channel 14 provides a bit in a multiple input signature (MISR) register 16. MISR 16 comprises linear feedback shift registers for ensuring that a unique bit pattern signature is compressed into the MISR at the completion of an LBIST sequence. An LBIST sequence comprises multiple LBIST cycles; and an LBIST cycle comprises a full scan load of all channels, followed by a functional system clock. Each subsequent scan load also simultaneously compresses a running signature into the MISR. The LBIST sequence is controlled by a Self-Test State Machine 18, which provides control signals to each OPCG(1–n) 20. Once an LBIST sequence is completed, MISR 16 will have a signature value that only matches a "good chip" signature, i.e., the signature of a properly functioning chip, if the chip under test also matches the good chip behavior. The system clock generated during LBIST by the OPCG has the same frequency as that generated by the OPCG during normal operation, thereby ensuring proper operation at machine speed.

In accordance with an aspect of the present invention, a technique is provided for simultaneous logic self-testing, e.g., LBIST, of internal logic and asynchronous boundary requirements of an IC having a plurality of clock domains. (A particular clock domain refers to a specified oscillator and a specified frequency.) In another aspect of the invention, the self-testing may be selectively performed on internal logic or asynchronous boundaries, or any combination thereof, of selectively chosen clock domains, or any combination thereof.

Figure 2:
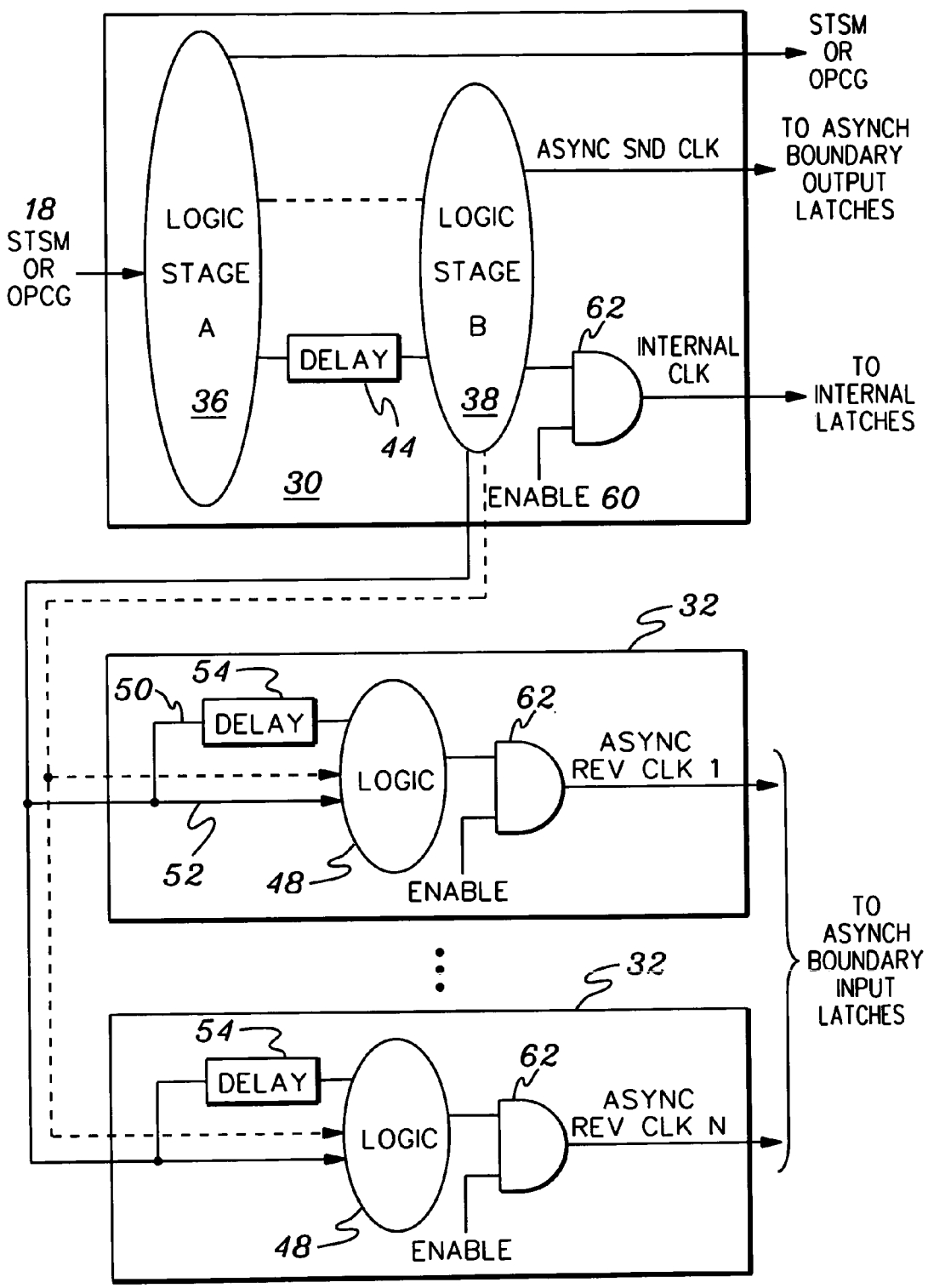
FIG. 2 depicts an OPCG configuration in support of internal and asynchronous boundary logic for an exemplary clock domain having N asynchronous boundary interfaces in accordance with an aspect of the present invention.

FIG. 2 illustrates an exemplary on product clock generation (OPCG) logic core structure 30 interfacing with N clock domains in accordance with preferred embodiments of the present invention. OPCG 30 receives commands from self-test state machine (STSM) 18, or another serially connected OPCG, and provides to asynchronous receive clock drivers 32 a functional clock sequence during normal operation, and a scan clock sequence or capture clock during LBIST testing operation. In the illustrated structure of FIG. 2, each respective first through Nth clock domain has a respective asynchronous receive clock driver 32 associated therewith. In FIG. 2, for purposes of illustration, data lines are represented as solid lines; and control lines are represented as dotted lines. It is further to be noted that aspects of the present invention are described herein with respect to an edge-triggered single clock latch design by way of example only; those of ordinary skill in the art will appreciate that the principles of the present invention are likewise applicable to a double-clocked latch design.

OPCG 30 is illustrated in FIG. 2 as comprising a first logic stage (Logic Stage A) 36, which generates an appropriate clock sequence, i.e., a test or functional clock sequence, in response to the command and mode of operation from STSM 18 (or other OPCG). In accordance with preferred embodiments of the present invention, the OPCG illustrated in FIG. 2 will at least support a normal mode of operation and a LBIST test mode of operation, but is not restricted to LBIST or to a single test mode of operation. For example, a scan mode could be employed as another test mode; and still other test modes are possible as will be appreciated by those skilled in the art. The present invention is described herein with regard to LBIST as a test mode of operation by way of example only.

During the normal mode of operation, there are no state transitions in the OPCG configuration, and only normal functional clocks are generated by logic stage 36 until STSM 18 signals a change in mode of operation, e.g., to LBIST mode. In LBIST mode, logic stage 36 generates scan clock sequences along with a single functional clock sequence. In particular, an exemplary LBIST iteration, or cycle, begins in the LBIST scan state, wherein scan clocks are generated. Upon completion of scanning operations, the cycle switches to the LBIST system clock state, wherein system clocks are generated in accordance with preferred embodiments of the present invention to test simultaneously and/or selectively the internal logic and asynchronous boundaries. The next LBIST iteration then begins by switching back to the LBIST scan state. The STSM determines the number of LBIST iterations, or cycles, to perform, before switching back to the normal mode of operation.

OPCG core 30 is illustrated in FIG. 2 as comprising a second logic stage (Logic Stage B) 38 for determining the type of clock sequence to send to the asynchronous receive clock drivers 32, and for forwarding the respective clock sequences to driver logic 48. In particular, logic stage 38 distributes the clock signals from Logic Stage A, depending on the mode of operation. In LBIST system clock mode, logic stage 38 blocks the launch clocks to the asynchronous receiver clocks. As illustrated in FIG. 2, all clock signals may comprise a delay 44 for synchronizing OPCG clock commands among multiple OPCG's that are serially connected during an LBIST operation. (See, for example, OPCG's 30 of FIG. 4 and FIG. 7.)

In one embodiment of the invention, the first logic stage 36 generates multiple scan clocks, as defined by a programmable counter (not shown), such that STSM 18 initiates the scan sequence for LBIST operation with one command, as an alternative to individual scan clock commands from the STSM.

For each asynchronous boundary, a common asynchronous boundary receive clock driver 32 is connected to OPCG 30. The control signal from OPCG logic stage 38 selects path 50 with delay 54 only during an LBIST system clock state, and path 52 (i.e., without a delay) otherwise. That is, in the LBIST system clock state of the LBIST mode of operation, the clock driver 32 is subject to programmable delay 54, such that the capture of signals at the asynchronous boundary receiver latches (not shown) will be subject thereto. In an LBIST scan state, the control signal from logic stage 38 selects path 52. And during the normal mode of operation, asynchronous boundary receive clock driver 32 generates the normal operational clock sequence on path 52.

As illustrated, in one aspect of the invention, enable signals 60 may be provided via logic 62 (e.g., AND gates) in the OPCG and asynchronous boundary receive clock drivers in order to allow for selective testing on internal logic or asynchronous boundaries, or any combination thereof. For example, selective logic self-testing may be performed in the following exemplary combinations: internal logic and asynchronous boundaries of a single clock domain on an IC; internal logic and asynchronous boundaries of multiple clock domains, each of which may be operating at a different frequency; internal logic and asynchronous boundaries of multiple clock domains, each of which may be running from an independent oscillator, i.e., having no phase alignment requirements; asynchronous boundaries of multiple asynchronous interfaces within a single clock domain; asynchronous boundary requirements of multiple clock domains, any of which may have multiple asynchronous interfaces; internal logic only of multiple clock domains; and so on.

Figure 3:
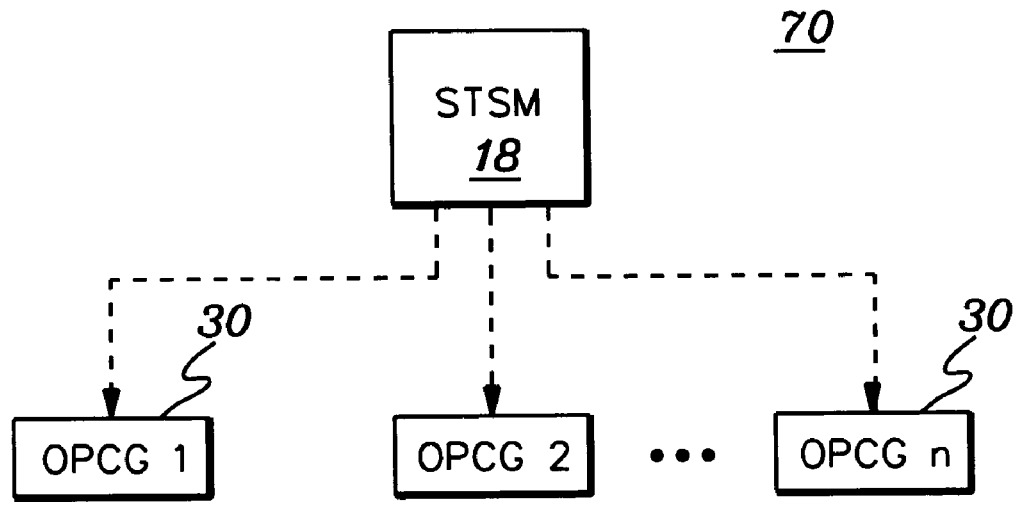
FIG. 3 depicts a centralized OPCG control structure in accordance with an aspect of the present invention.
Figure 4:
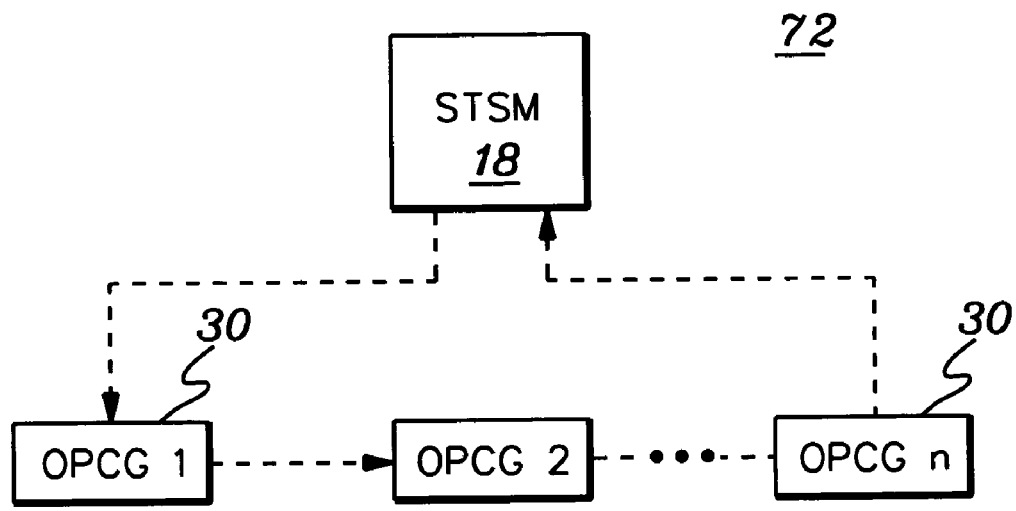
FIG. 4 depicts a distributed OPCG control structure in accordance with an aspect of the present invention.

FIG. 3 illustrates a centralized type OPCG control 70 wherein commands are generated to each clock domain's separate OPCG 30 from STSM 18. Alternatively, FIG. 4 illustrates a distributed type OPCG control 72 wherein commands are generated to each clock domain's OPCG 30 from another serially connected OPCG, wherein the first OPCG in the serial chain receives the initial command from the STSM.

By definition, there is no single specification for the timing relationship at an asynchronous boundary. Typically, there is a worst-case specification, i.e., a maximum skew between launch and capture clocks across the boundary; and a best-case specification, i.e., a minimum skew between launch and capture clocks across the boundary. In between, there are an infinite number of case scenarios, representing different phase relationships. Advantageously, in accordance with an aspect of the present invention, a method is provided for self-testing all asynchronous boundaries (or a selective number thereof) during the same LBIST test sequence that tests the internal logic of the IC. This method allows for normal clock drift for each clock domain, but assures that the clock command, which is running on a common OPCG clock domain, is issued at the same cycle for all OPCG's. Advantageously, this reduces tuning to the OPCG clock domain, which would typically run at slower clock frequency. The command is received by clock gating logic (Logic Stage A of FIG. 2) in the OPCG, which in turn generates a launch clock and a capture clock to the internal logic and asynchronous boundary latches at machine speed. Because the asynchronous boundary receive latches are controlled by a different logic distribution path (Logic Stage B of FIG. 2), they receive a single capture clock subject to a programmable delay 54. By issuing the clock command such that it is latched on the next capture phase of the host clock domain, the natural drift between clocks running at different frequencies is used to sweep through the range of phase relationships, using a number of LBIST iterations as determined by the random nature of LBIST iterations when the OPCG clock frequency is not the same as any of the functional clock frequencies. Alternatively, if desired, randomness could be directly injected between STSM iterations.

Figure 5:
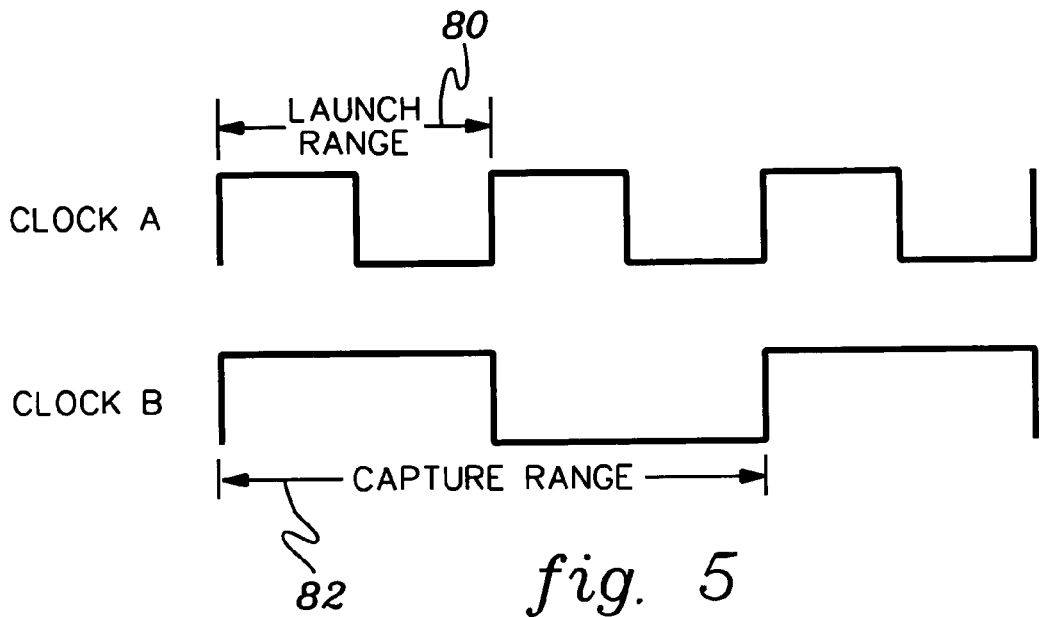
FIG. 5 and FIG. 6 depict exemplary phase relationships between launch and capture clocks for asynchronous boundary driver latches of two clock domains, each of which is running at a different clock frequency.
Figure 6:
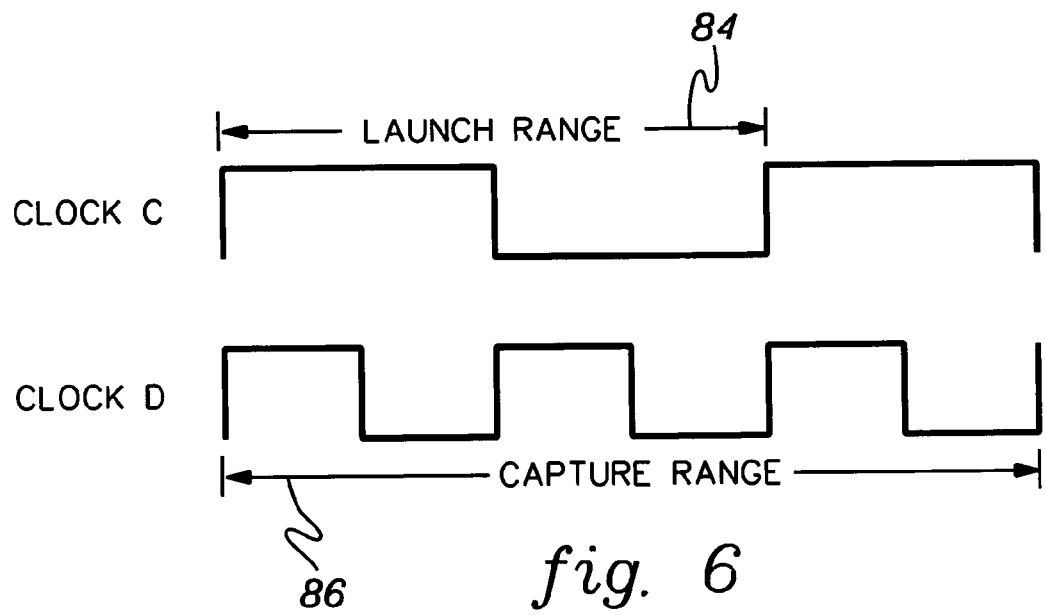

FIG. 5 and FIG. 6 each graphically illustrate exemplary phase relationships between two clock frequencies of different clock domains. Those skilled in the art will appreciate that the specifications for the launch and receive clocks could be expanded beyond the illustrated examples of FIG. 5 and FIG. 6; these are provided by way of example only for illustrative purposes.

FIG. 5 illustrates an exemplary launch clock range 80 and capture clock range 82 for a case wherein the launch clock (Clock A) frequency is faster than the capture clock (Clock B) frequency. Beyond this exemplary range, any analysis would be redundant due to the periodicity of the launch clock, as well as the fact that other OPCG clocks are being launched at the same time. As illustrated by the capture range signal, any signal launched from the rising edge of Clock A could be captured predictably by Clock B in the next cycle.

FIG. 6 illustrates a case wherein a slower clock frequency (Clock C) launches data to a faster clock frequency (Clock D). In this case, the capture range 86 spans multiple cycles with respect to launch range 84, such that the asynchronous interface receive logic at Clock D supports a multi-cycle delay in capturing signals from Clock C. Advantageously, an aspect of the LBIST testing described herein incorporates functional testing for proper operation up to the bounds of the delay defined in the asynchronous delay counter for such an asynchronous boundary. As long as predictable and repeatable values are being captured, as a result of the imposed capture delay, the LBIST signature reflects proper operation. In order to arrive at expected values for the asynchronous boundary latches, a relatively long delay 54 (FIG. 2) needs to be supplied to all asynchronous driver receive latches, thereby assuring DC operation at all the asynchronous boundaries. As long as circuit operation matches expected values, when the maximum tolerable delays are substituted, then the asynchronous boundaries are advantageously tested against the predetermined requirements of each asynchronous boundary in a single LBIST sequence.

Figure 7:
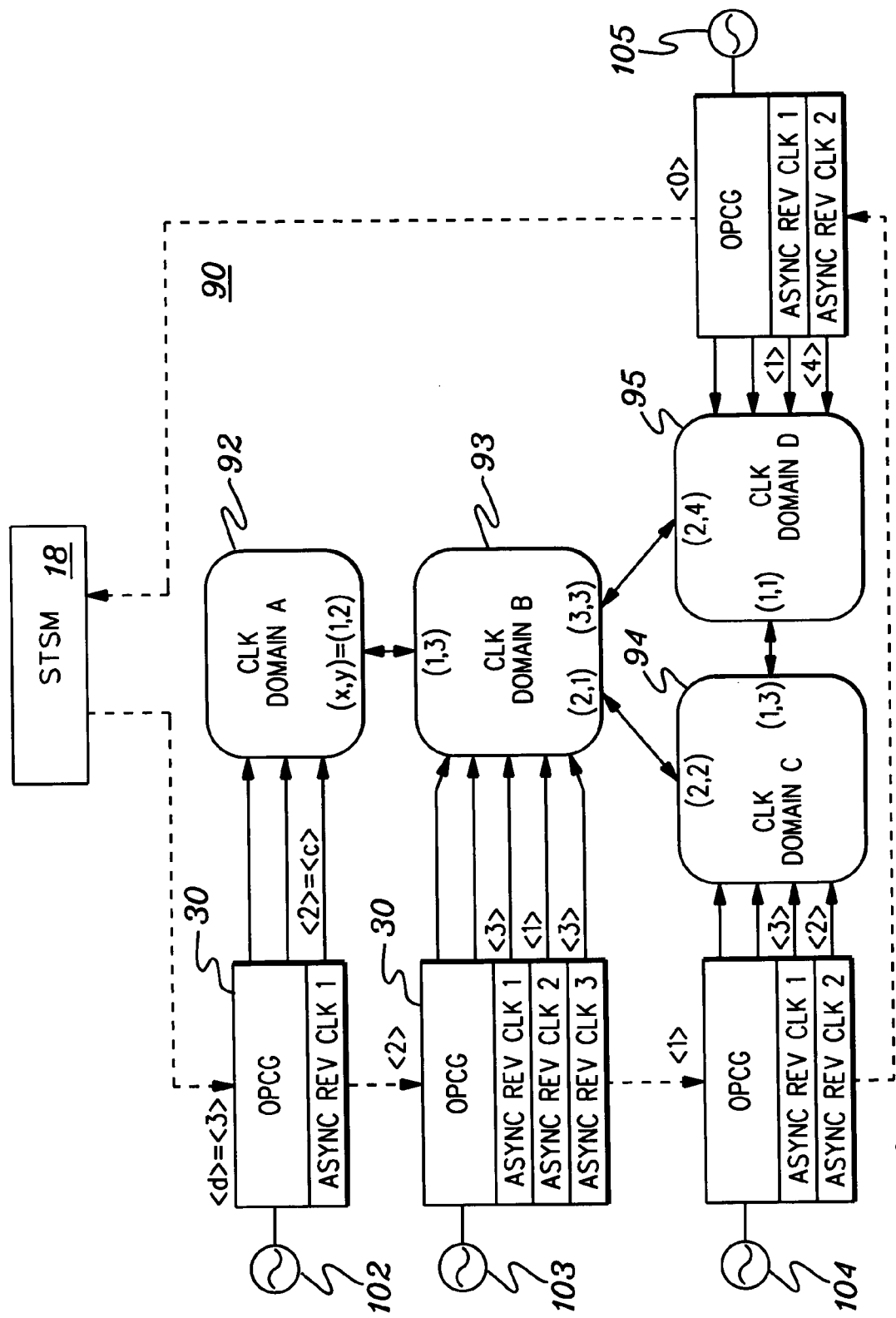
FIG. 7 depicts an exemplary system for LBIST of multiple clock domains in accordance with an aspect of the present invention.

FIG. 7 illustrates an exemplary embodiment of the present invention for an IC chip 90 having four clock domains 92-95, respectively. FIG. 7 shows four clock domains by way of example only, as those skilled in the art will appreciate that the principles of the present invention apply to any number of clock domains N. Also by way of example only, FIG. 7 illustrates serially connected OPCG's 30 controlled by central STSM 18, Each clock domain 92-95, respectively, represents circuitry that is running at a predetermined clock frequency, as determined by the logic circuitry thereof. By way of example, FIG. 7 illustrates a separate clock oscillator 102-105, respectively for each OPCG. Alternatively, however, the separate respective oscillator input frequencies 102-105, respectively, could be derived from a common oscillator. The exemplary communication topology among clock domains 92-95 is illustrated as follows: clock domain 92 has one asynchronous boundary; clock domain 93 has three asynchronous boundaries; and clock domains 94 and 95 each have two asynchronous boundaries. Each clock domain has a predetermined cycle requirement for each of its asynchronous boundaries, i.e., the maximum number of cycles, relative to the clock domain frequency, that an external signal has to propagate to this asynchronous interface of the clock domain.

In accordance with an aspect of the present invention, the asynchronous boundary requirements are defined exclusively from the perspective of the asynchronous boundary receiver latches interfacing with each external clock domain. This perspective provides independence from the set of potential external drivers to the associated asynchronous boundary receiver latches, within the predetermined limits, thereby allowing the clock domain circuitry to be designed without a priori knowledge of how it will be aggregated into a chip.

In FIG. 7, the communication topology is designated as (x, y) at each asynchronous boundary of each clock domain, wherein x represents the boundary identification number, and y represents the predetermined cycle requirement for that boundary. In addition, a number <d> is associated with each OPCG block in FIG. 7, and illustrated at the top thereof, to represent the cycle delay, relative to a common OPCG clock frequency, for the serial OPCG topology.

With the communication topology thus determined, a clocking nest is provided in accordance with an aspect of the present invention to provide simultaneous logic self-testing and asynchronous boundary testing for IC chip 90. In accordance therewith, an OPCG core is instantiated for each clock domain; an asynchronous receiver clock driver macro is instantiated for each asynchronous interface; and a programmable delay is provided for matching the asynchronous boundary cycle requirements of the interface. The bracketed number <c> associated with each asynchronous receive clock driver is the respective cycle delay value, relative to the clock domain frequency, used for testing the respective asynchronous boundary requirements thereof. In particular, asynchronous boundary logic is functionally designed to tolerate a signal's arrival within a predetermined number <c> of cycles, as an upper bound.

Advantageously, a method of self-testing of internal logic and asynchronous boundaries in accordance with preferred embodiments of the present invention facilitates aggregation of independently designed logic circuits employed in SoC's, Systems on a Chip, without requiring a priori knowledge of the aggregate clock frequencies utilized therein. Such a method further advantageously provides predictability at the asynchronous boundaries, such that the resulting signature in the MISR is predictable, and hence a high probability of matching a good chip signature. As a further advantage, self-testing of internal logic and asynchronous boundaries is achieved with low design overhead. Still further, flexibility is provided by selective testing of internal logic and/or asynchronous boundaries in any combination of clock domains on an IC chip.

The present invention can be included in an article of manufacture (e.g., one or more computer program products) having, for instance, computer usable media. The media has embodied therein, for instance, computer readable program code means for providing and facilitating the capabilities of the present invention. The article of manufacture can be included as a part of a computer system or sold separately.

Additionally, at least one program storage device readable by a machine embodying at least one program of instructions executable by the machine to perform the capabilities of the present invention can be provided.

The timing diagrams depicted herein are just examples. There may be many variations to these diagrams without departing from the spirit of the invention. All of these variations are considered a part of the claimed invention.

Although preferred embodiments have been depicted and described in detail herein, it will be apparent to those skilled in the relevant art that various modifications, additions, substitutions and the like can be made without departing from the spirit of the invention and these are therefore considered to be within the scope of the invention as defined in the following claims.

What is claimed is:

1. An LBIST system for testing integrated circuitry comprising a plurality of clock domains, each clock domain having a respective frequency associated therewith, the integrated circuitry further comprising at least one asynchronous boundary between at least two of the clock domains, each asynchronous boundary having predetermined cycle requirements, the system comprising:
   a clock generator generating a clock command, comprising generating a launch clock and a capture clock, for each clock domain simultaneously; and
   an asynchronous receive clock generator associated with each clock domain, each asynchronous receive clock driver generating a clock having a predictable number of cycles relative to the frequency of the respective clock domain, the asynchronous receive clock providing a programmable delay to the capture clock, the programmable delay being based on the respective predetermined cycle requirements; and
   control logic for the clock generator and each asynchronous receive clock generator consolidated in a clock generator logic control.

2. The system of claim 1, further comprising selection logic for selective testing of at least one clock domain, or a combination of selected ones of the plurality of clock domains.

3. The system of claim 1, wherein the clock generator further provides a mode of operation command for commanding operation in a normal mode or a test mode.

4. The system of claim 1, wherein the clock generator generates a mode of operation command for commanding operation in a normal mode or an LBIST mode, the LBIST mode further comprising a LBIST scan mode and a LBIST system state mode.

5. The system of claim 1, further comprising selection logic for selective testing of at least one clock domain or one asynchronous boundary, or a combination of selected ones of either the clock domains or the asynchronous boundaries, or a combination of selected ones of both the clock domains and the asynchronous boundaries.

6. An article of manufacture comprising:
   at least one computer usable medium having computer readable program code means embodied therein for effecting LBIST testing of integrated circuitry comprising a plurality of clock domains, each clock domain having a respective frequency associated therewith, the integrated circuitry further comprising at least one asynchronous boundary between at least two of the clock domains, each asynchronous boundary having predetermined cycle requirements, the computer readable program code means in the article of manufacture comprising:
   computer readable code means for generating a clock command, comprising generating a launch clock and a capture clock, for each clock domain simultaneously; and
   computer readable code means for providing an asynchronous receive clock for each clock domain having a predictable number of cycles relative to the frequency of the respective clock domain, and further providing a programmable delay to the capture clock, the programmable delay being based on the respective predetermined cycle requirements;
   wherein the computer readable code means for generating a clock command, and the computer readable code means for providing an asynchronous receive clock for each clock domain further comprise consolidated clock generator logic control means.

* * * * *